(12) United States Patent
Thavarajah et al.

(10) Patent No.: US 6,603,201 B1
(45) Date of Patent: Aug. 5, 2003

(54) ELECTRONIC SUBSTRATE

(75) Inventors: Manickam Thavarajah, San Jose, CA (US); Maurice O. Othieno, Union City, CA (US); Severino A. Legaspi, Jr., Santa Clara, CA (US); Pradip D. Patel, Redwood City, CA (US)

(73) Assignee: LSI Logic Corporation, Milpitas, CA (US)

( * ) Notice: Subject to any disclaimer, the term of this patent is extended or adjusted under 35 U.S.C. 154(b) by 12 days.

(21) Appl. No.: 10/278,373

(22) Filed: Oct. 23, 2002

(51) Int. Cl.$^7$ ............................................. H01L 23/12
(52) U.S. Cl. ................. 257/700; 257/701; 257/702; 257/738; 257/758; 257/778; 438/108; 438/125; 438/126; 174/256; 174/258; 174/260; 174/262; 361/749; 361/750; 361/792
(58) Field of Search .................. 257/678, 700, 257/701, 702, 703, 738, 758, 759, 778, 787; 438/108, 125, 126; 174/255, 256, 258, 260, 262; 361/748, 749, 750, 783, 792

(56) References Cited

U.S. PATENT DOCUMENTS

| | | | | |
|---|---|---|---|---|
| 4,876,120 A | * | 10/1989 | Belke et al. | 428/1.54 |
| 5,484,647 A | * | 1/1996 | Nakatani et al. | 428/209 |
| 5,785,789 A | * | 7/1998 | Gagnon et al. | 156/235 |
| 5,876,842 A | * | 3/1999 | Duffy et al. | 428/209 |
| 5,942,315 A | * | 8/1999 | Johnston | 428/209 |
| 6,048,430 A | * | 4/2000 | Johnston | 156/233 |
| 6,329,610 B1 | * | 12/2001 | Takubo et al. | 174/264 |

FOREIGN PATENT DOCUMENTS

| | | | | |
|---|---|---|---|---|
| JP | 03250648 A | * | 11/1991 | H01L/23/14 |
| JP | 04125140 A | * | 4/1992 | B32B/15/08 |
| JP | 05029764 A | * | 2/1993 | H05K/3/46 |
| JP | 07050486 A | * | 2/1995 | H05K/3/46 |

* cited by examiner

*Primary Examiner*—David L. Talbott
*Assistant Examiner*—Alonzo Chambliss
(74) *Attorney, Agent, or Firm*—Luedeka, Neely & Graham, PC

(57) ABSTRACT

A package substrate having sides, which is formed of multiple non electrically conductive layers laminated together. Each of the multiple non electrically conductive layers is formed of a first lamina and a second lamina bonded together in a resin matrix. The first lamina is formed of woven fibers having a first warp. The first warp of the first lamina is disposed at a positive orientation of a first angle from the sides of the package substrate, where the first angle is neither zero degrees nor ninety degrees. The second lamina is also formed of woven fibers, having a second warp. The second warp of the second lamina is disposed at a negative orientation of the first angle from the sides of the package substrate. Electrically conductive layers are dispersed between different ones of the multiple non electrically conductive layers, with electrical connections dispersed between different ones of the electrically conductive layers.

16 Claims, 1 Drawing Sheet

ELECTRONIC SUBSTRATE

FIELD

This invention relates to the field of integrated circuit fabrication. More particularly, this invention relates to the construction of electronic substrates, or in other words package substrates, to which monolithic integrated circuits are mounted during packaging.

BACKGROUND

Electronic substrates, also called printed circuit boards or package substrates, are used as a platform for monolithic integrated circuits, such as array products like ball grid arrays, to which the monolithic integrated circuit is mounted and encapsulated.

The package substrate is typically formed of several electrically conductive layers, sandwiched between non electrically conductive layers and a non electrically conductive core. The electrically conductive layers, typically formed of a metal such as copper, are used for power and signal routing. The non electrically conductive core provides structural strength to the substrate, and reduces damage to the package from stresses such as those induced by mechanical load and thermal energy.

If careful attention is not paid to how the core is constructed, then the core will not perform its intended functions properly, and the packaged integrated circuit may fail. The non electrically conductive core is often formed of layers of woven glass fibers, called laminae. The laminae are stacked together in a resin matrix. Typically, a single lamina is woven of fibers that cross at right angles, or in other words at ninety degrees. The laminae are stacked in the resin, one on top of the other, typically without regard to how the fibers of the laminae are oriented one to another.

Unfortunately, a package substrate formed in this manner tends to twist, bend and otherwise warp when subjected to thermal loading, such as when the packaged integrated circuit is operating within a larger electronic circuit.

What is needed, therefore, is a package substrate design that has a greater resistance to problems such as thermal warpage.

SUMMARY

The above and other needs are met by a package substrate having sides, which is formed of multiple non electrically conductive layers laminated together. Each of the multiple non electrically conductive layers is formed of a first lamina and a second lamina bonded together in a resin matrix. The first lamina is formed of woven fibers having a first warp and a first weft. The first warp of the first lamina is disposed at a positive orientation of a first angle from the sides of the package substrate, where the first angle is neither zero degrees nor ninety degrees. The second lamina is also formed of woven fibers, having a second warp and second weft. The second warp of the second lamina is disposed at a negative orientation of the first angle from the sides of the package substrate. Electrically conductive layers are dispersed between different ones of the multiple non electrically conductive layers, with electrical connections dispersed between different ones of the electrically conductive layers.

In this manner, the alternating first and second warps of the first and second laminae reduce and preferably eliminate warpage of the package substrate, such as can be induced by thermal stresses. Further, because the warps are not disposed either parallel to or at ninety degrees to the sides of the package substrate, and therefore are similarly not disposed at either angle to the top and bottom of an orthogonal package substrate, there is a greater resistance to warpage of the package substrate.

In various preferred embodiments, the woven fibers of the first lamina and the second lamina are glass fibers. The electrically conductive layers are preferably formed of copper. Preferably, the first angle is between about thirty degrees and about sixty degrees. Also described is a packaged integrated circuit, comprising a substrate as described above, and a monolithic integrated circuit mounted to the substrate. Preferably, the monolithic integrated circuit is an application specific integrated circuit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
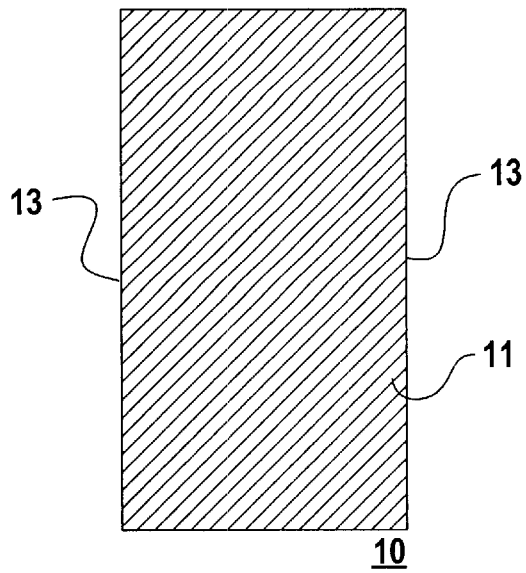
FIG. 1 is a top plan view of a first lamina.
Figure 3:
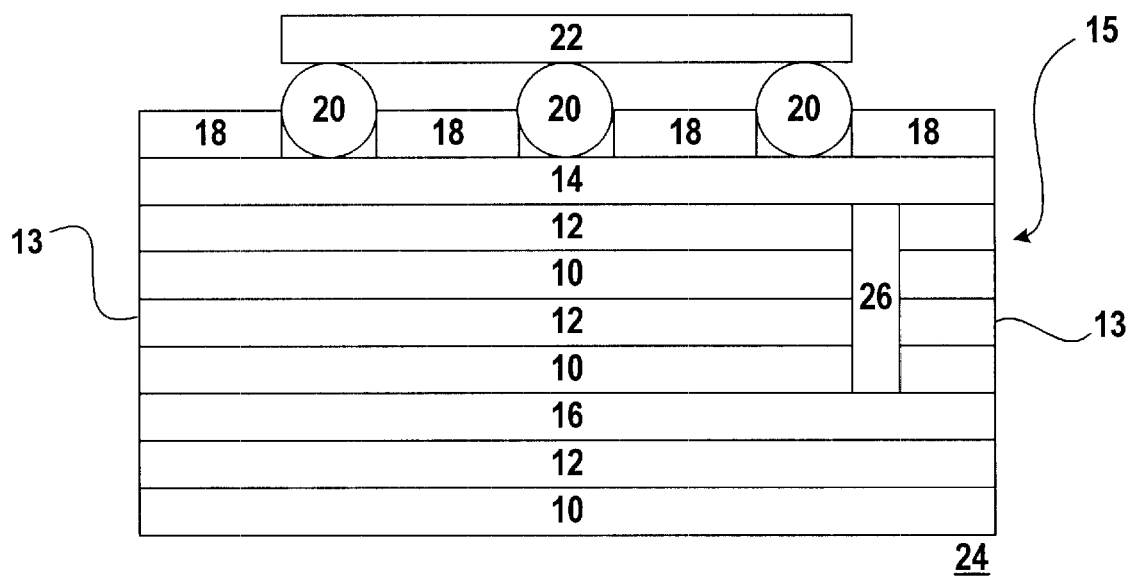
FIG. 3 is a cross sectional view of a packaged integrated circuit.

With reference now to FIG. 1, there is depicted a top plan view of a first lamina 10, having a first warp 11 disposed at a first angle relative to the sides 13 of the first lamina 10, which will eventually be the sides of, or parallel to the sides of, the package substrate 15 of FIG. 3. The lamina 10 is preferably a woven fabric of fibers, such as glass fibers. Other fibers may also be used. However, the lamina 10 is preferably non electrically conducting. It is appreciated that there are also weft fibers in the lamina 10, which are not depicted in FIG. 1 so as to not clutter the figure with details that are not as essential to the description of the invention. The warp 11 is preferably disposed at a positive orientation of the first angle from the sides 13 of what will be the package substrate 15. The first angle is most preferably between about thirty degrees and about sixty degrees, and is preferably not substantially equal to either zero degrees or ninety degrees. In other words, the first warp 11 of the first lamina 10 is neither parallel to nor perpendicular to the sides 13.

Figure 2:
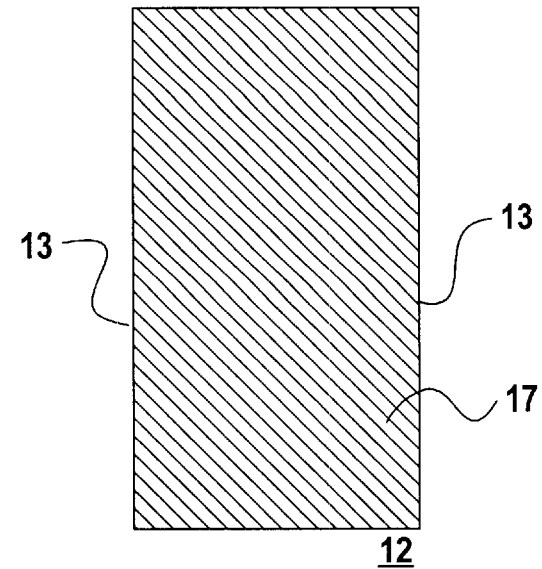
FIG. 2 is a top plan view of a second lamina.

With reference now to FIG. 2, there is depicted a top plan view of a second lamina 12, having a second warp 17 disposed at the same first angle relative to the sides 13 of the second lamina 10, which will eventually be the sides of, or parallel to the sides of, the package substrate 15 of FIG. 3. The lamina 12 is also a woven fabric of fibers, such as glass fibers. Other fibers may also be used, however, the lamina 12 is preferably non electrically conducting. It is appreciated that there are also weft fibers in the lamina 12, which are not depicted in FIG. 2 so as to not clutter the figure with details that are not as essential to the description of the invention. The warp 17 is preferably disposed at a negative orientation of the first angle from the sides 13 of what will be the package substrate 15. Thus, the second warp 17 of the second lamina 12 is similarly neither parallel to nor perpendicular to the sides 13.

A non electrically conductive layer is formed by laminating the first lamina 10 with the second lamina 12, in such a manner that the first warp 11 is disposed in the positive orientation of the first angle and the second warp 17 is disposed in the negative orientation of the first angle. In the limited case where the first angle is forty-five degrees, this will place the first warp 11 at a ninety degree angle to the second warp 17. However, in other cases of first angles as described above, the first warp 11 and the second warp 17 will be disposed at angles varying from about sixty degrees to about one hundred and twenty degrees from each other. However, neither the first warp 11 nor the second warp 17 are ever disposed at either zero degrees or ninety degrees from the sides 13 of the package substrate 15, which also means that neither the first warp 11 nor the second warp 17 are ever disposed at either zero degrees or ninety degrees from the top or bottom of an orthogonal package substrate 15.

The first lamina 10 and the second lamina 12 are bonded together using a resin matrix. Such bonded pairs constitute a non electrically conductive layer, as termed herein. Multiple non electrically conductive layers are then laminated together, with the all of the first warps 11 disposed in substantially the same orientation as described above, and all of the second warps 17 disposed in substantially the same orientation as described above, to form the package substrate 15. Such laminated multiple non electrically conductive layers form a structure, such as layers of or a core of a package substrate 15.

Dispersed throughout the package substrate 15 are various electrically conductive layers 14 and 16, which are preferably formed of copper, but which may be formed of any electrically conductive material that is compatible with the structures, processes, and functions as are described and implied herein. The package substrate 15 may have a top layer 18, such as formed with a solder mask material, through which electrical connections 20 are made to an integrated circuit 22, such as an application specific integrated circuit.

It is appreciated that the depiction of the packaged integrated circuit 24 as given in FIG. 3 is representational only, and is not intended to be limiting. For example, in FIG. 3, only two of the non electrically conductive layers, being laminated pairs of the laminae 10 and 12, are depicted, and the two that are depicted are at the core of the package substrate 15. Further, there are only two conductive layers 14 and 16 depicted. It is appreciated that in actual implementation there would preferably be many more non electrically conductive layers and electrically conductive layers, in various interleaved arrangements. Further, electrically conductive vias, such as represented by via 26, would preferably be employed to electrically conduct various ones of the electrically conductive layers.

Package substrates 15 formed in the manner as described above tend to have increased stiffness properties, which helps reduce cracking of the electrically conductive layers, reduces warpage or twisting of the package substrate 15 during thermal loading, and reduces the occurrence of failures of the packaged integrated circuit 24 from delamination and subsequent corrosion. Thus, the package substrate 15 as described provides additional dimensional stability.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A package substrate having sides, comprising:
   multiple non electrically conductive layers laminated together, each of the multiple non electrically conductive layers formed of;
      a first lamina formed of woven fibers having a first warp, the first warp of the first lamina disposed at a positive orientation of a first angle from the sides of the package substrate, where the first angle is neither zero degrees nor ninety degrees,
      a second lamina formed of woven fibers having a second warp, the second warp of the second lamina disposed at a negative orientation of the first angle from the sides of the package substrate, and
      the first lamina and the second lamina bonded together in a resin matrix to reduce warpage of the package substrate, and
   electrically conductive layers, with electrical connections dispersed between different ones of the electrically conductive layers.

2. The package substrate of claim 1, wherein the woven fibers of the first lamina and the second lamina are glass fibers.

3. The package substrate of claim 1, wherein the electrically conductive layers are formed of copper.

4. The package substrate of claim 1, wherein the first angle is between about thirty degrees and about sixty degrees.

5. A packaged integrated circuit, the improvement comprising the package substrate of claim 1.

6. A packaged integrated circuit, comprising:
   a substrate having sides, formed of;
      multiple non electrically conductive layers laminated together, each of the multiple non electrically conductive layers formed of;
         a first lamina formed of woven fibers having a first warp, the first warp of the first lamina disposed at a positive orientation of a first angle from the sides of the package substrate, where the fist angle is neither zero degrees nor ninety degrees,
         a second lamina formed of woven fibers having a second warp, the second warp of the second lamina disposed at a negative orientation of the first angle from the sides of the package substrate, and
         the first lamina and the second lamina bonded together in a resin matrix to reduce warpage of the substrate, and
      electrically conductive layers, with electrical connections dispersed between different ones of the electrically conductive layers, and
   a monolithic integrated circuit mounted to the substrate.

7. The packaged integrated circuit of claim 6, wherein the woven fibers of the first lamina and the second lamina are glass fibers.

8. The packaged integrated circuit of claim 6, wherein the electrically conductive layers are formed of copper.

9. The packaged integrated circuit of claim 6, wherein the first angle is between about thirty degrees and about sixty degrees.

10. The packaged integrated circuit of claim 6, wherein the monolithic integrated circuit is an application specific integrated circuit.

11. A method of forming a non electrically conductive layer for a package substrate, the method comprising the steps of:
- disposing a first lamina formed of woven fibers and having a first warp, with the first warp at a positive oration of a first angle to a reference, where the first angle is neither zero degrees nor ninety degrees,
- disposing a second lamina formed of woven fibers and having a second warp, with the second warp at a negative orientation of the first angle to the reference, on top of the first lamina, and
- bonding the first lamina to the second lamina using a resin matrix to form the non electrically conductive layer for the package substrate to reduce warpage of the package substrate.

12. The method of claim 11, further comprising the step of bonding a plurality of the non electrically conductive layers together to form a core for the package substrate.

13. The method of claim 11, wherein the woven fibers of the first lamina and the second lamina are glass fibers.

14. The method of claim 11, wherein the electrically conductive layers are formed of copper.

15. The method of claim 11, wherein the first angle is between about thirty degrees and about sixty degrees.

16. A packaged integrated circuit, the improvement comprising a package substrate formed by the method of claim 11.

* * * * *